(12) United States Patent
Yamazaki

(10) Patent No.: US 8,361,836 B2
(45) Date of Patent: Jan. 29, 2013

(54) METHOD FOR MANUFACTURING PHOTOELECTRIC CONVERSION ELEMENT AND PHOTOELECTRIC CONVERSION ELEMENT

(75) Inventor: Tsutomu Yamazaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/255,315

(22) PCT Filed: Mar. 15, 2010

(86) PCT No.: PCT/JP2010/054316
§ 371 (c)(1),
(2), (4) Date: Sep. 8, 2011

(87) PCT Pub. No.: WO2010/110106
PCT Pub. Date: Sep. 30, 2010

(65) Prior Publication Data
US 2011/0318874 A1  Dec. 29, 2011

(30) Foreign Application Priority Data

Mar. 27, 2009  (JP) ................................. 2009-080134

(51) Int. Cl.
*H01L 21/00* (2006.01)
(52) U.S. Cl. ................ 438/98; 438/71; 438/78; 438/83; 257/E31.124; 257/E31.13
(58) Field of Classification Search .................. None
See application file for complete search history.

(56) References Cited

U.S. PATENT DOCUMENTS

| 4,825,335 | A  | * | 4/1989  | Wilner ......................... 361/283.3 |
| 5,591,650 | A  | * | 1/1997  | Hsu et al. ....................... 438/154 |
| 6,012,336 | A  | * | 1/2000  | Eaton et al. ..................... 73/754 |
| 7,544,544 | B2 | * | 6/2009  | Cogan et al. .................... 438/133 |
| 2009/0305456 | A1 | * | 12/2009 | Funakoshi ....................... 438/98 |
| 2012/0018739 | A1 | * | 1/2012  | Liang et al. ..................... 257/77 |

FOREIGN PATENT DOCUMENTS

| EP | 0 933 822 | 8/1999 |
| JP | 11-274538 | 10/1999 |

(Continued)

OTHER PUBLICATIONS

International Search Report for PCT/JP2010/054316, mailed Apr. 20, 2010.

*Primary Examiner* — Seahvosh Nikmanesh
*Assistant Examiner* — Evren Seven
(74) *Attorney, Agent, or Firm* — Nixon & Vanderhye P.C.

(57) ABSTRACT

A method for manufacturing a photoelectric conversion element and a photoelectric conversion element manufactured by the manufacturing method. The method includes the steps of forming a p-type impurity diffusion layer by diffusing boron into a silicon substrate, forming an oxidation control mask on a surface of the p-type impurity diffusion layer in an area corresponding to an area where an electrode for p-type is to be formed, forming a thermal silicon oxide film on the surface of the p-type impurity diffusion layer, exposing part of the surface of the p-type impurity diffusion layer by removing the oxidation control mask formed on the surface of the p-type impurity diffusion layer in the area corresponding to the area where the electrode for p-type is to be formed, and forming the electrode for p-type on the part of the surface of the p-type impurity diffusion layer exposed by the removal of the oxidation control mask.

3 Claims, 3 Drawing Sheets

FOREIGN PATENT DOCUMENTS

| JP | 2005-260157 | 9/2005 |
| JP | 2005-310830 | 11/2005 |
| JP | A 2007-088254 | * 4/2007 |
| JP | 2008-311291 | 12/2008 |

* cited by examiner

FIG.3
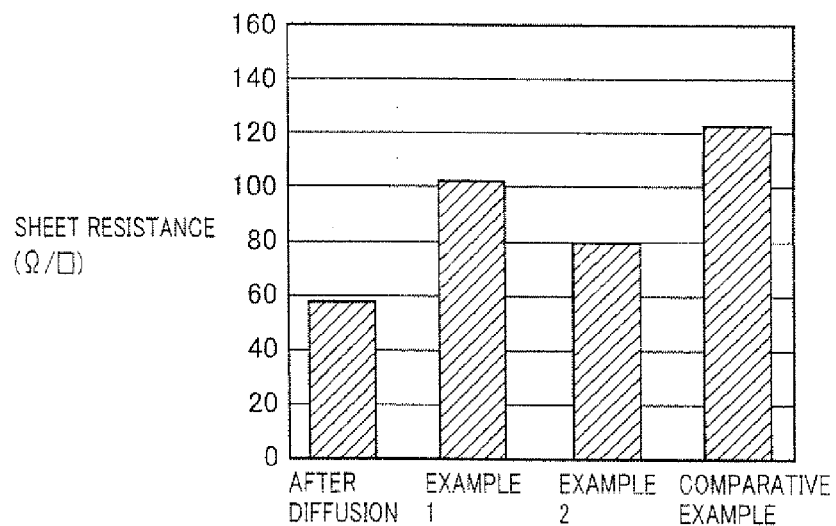
FIG.4
(a)
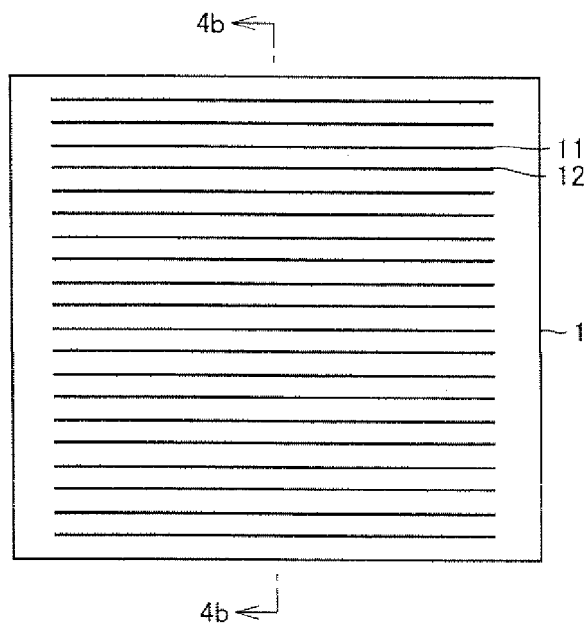
(b)
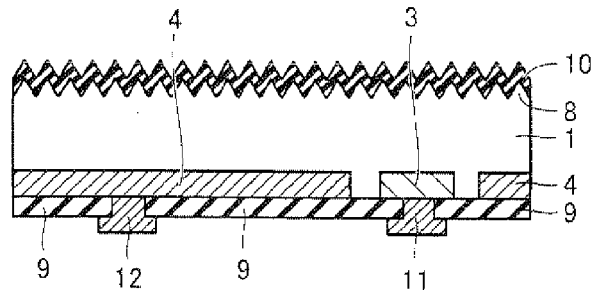

METHOD FOR MANUFACTURING PHOTOELECTRIC CONVERSION ELEMENT AND PHOTOELECTRIC CONVERSION ELEMENT

This application is the U.S. national phase of International Application No. PCT/JP2010/054316, filed 15 Mar. 2010, which designated the U.S. and claims priority to JP Application No. 2009-080134, filed 27 Mar. 2009, the entire contents of each of which are hereby incorporated by reference.

TECHNICAL FIELD

The present invention relates to a method for manufacturing a photoelectric conversion element and to a photoelectric conversion element. The present invention particularly relates to a method for manufacturing a photoelectric conversion element capable of suppressing a decrease in power generation efficiency and to a photoelectric conversion element manufactured by the manufacturing method.

BACKGROUND ART

Development of clean energy has recently been desired in view of the problem of exhaustion of energy resources and the global environment problem such as an increase in $CO_2$ in the air, and photovoltaic power generation employing photoelectric conversion elements, in particular solar cells has been developed and put into practice as a new energy source, and is now on the way to progress.

A conventional mainstream solar cell is a bifacial solar cell which is manufactured, for example, by diffusing, into a light receiving surface of a silicon substrate of monocrystalline or polycrystalline silicon, an impurity of a conduction type opposite to that of the substrate so that a pn junction is formed, and forming electrodes at the light receiving surface and the back surface of the silicon substrate opposite to the light receiving surface, respectively. In the bifacial solar cell, it is also common to diffuse an impurity of the same conduction type as that of the silicon substrate into the back surface of the silicon substrate at a high concentration, thereby to achieve higher output by a back surface field effect.

Research and development is also being made on a back electrode type solar cell without an electrode formed at a light receiving surface of the solar cell but with an electrode formed only at the back surface (See, for example, Japanese Patent Laying-Open No. 2005-310830 (Patent Literature 1)).

The back electrode type solar cell, generally having no electrode on the light receiving surface, has no shadow loss resulting from an electrode on the light receiving surface, and can be expected to provide an output higher than that of the bifacial solar cell. Therefore, making use of such properties, the back electrode type solar cell is applied to a solar car or a concentrator solar cell.

FIG. 4(a) shows a schematic plan view of an example of the back surface of a conventional back electrode type solar cell, and FIG. 4(b) shows a schematic cross sectional view along 4b-4b in FIG. 4(a). Herein, the back electrode type solar cell shown in FIGS. 4 (a) and (b) is configured to have an n-type silicon substrate 1, on the back surface of which strip-like electrodes for n-type 11 and strip-like electrodes for p-type 12 are arrayed alternatively, as shown in FIG. 4(a).

Furthermore, as shown in FIG. 4(b), at the back surface of n-type silicon substrate 1, a strip-like high-concentration n-type impurity diffusion layer 3 formed by diffusion of phosphorus serving as an n-type impurity, and a strip-like high-concentration p-type impurity diffusion layer 4 formed by diffusion of boron serving as a p-type impurity are formed alternatively at a predetermined spacing.

It is noted that although FIG. 4(b) shows only one each of high-concentration n-type impurity diffusion layer 3 and high-concentration p-type impurity diffusion layer 4 for illustration purpose, there actually are the same number of high-concentration n-type impurity diffusion layers 3 as that of strip-like electrodes for n-type 11 and the same number of high-concentration p-type impurity diffusion layers 4 as that of strip-like electrodes for p-type 12. Further, strip-like electrodes for n-type 11 are in contact with respective high-concentration n-type impurity diffusion layers 3 and strip-like electrodes for p-type 12 are in contact with respective high-concentration p-type impurity diffusion layers 4.

Furthermore, on the back surface of n-type silicon substrate 1, a passivation film 9 is provided. Through an opening provided in passivation film 9, electrode for n-type 11 is in contact with high-concentration n-type impurity diffusion layer 3, and electrode for p-type 12 is in contact with high-concentration p-type impurity diffusion layer 4.

In addition, formed at a light receiving surface opposite to the back surface of n-type silicon substrate 1 is a textured structure 8 which is formed of pyramid-like irregularities, for example, and formed on textured structure 8 is an antireflection film 10.

The back electrode type solar cell configured as above is capable of taking a larger amount of sunlight in because no electrode is formed on the light receiving surface, which is a surface of n-type silicon substrate 1 on which the sunlight is incident.

CITATION LIST

Patent Literature

PTL 1: Japanese Patent Laying-Open No. 2005-310830

SUMMARY OF INVENTION

Technical Problem

In the back electrode type solar cell of the above-described configuration, n-type silicon substrate 1 is heat-treated in an oxygen-containing atmosphere to form a thermal silicon oxide film, which servers as passivation film 9. Generally, passivation film 9 is formed for preventing carrier recombination at the back surface of n-type silicon substrate 1.

In a case where passivation film 9 is formed in the manner as described above, however, during the growth of the thermal silicon oxide film on n-type silicon substrate 1, a phenomenon occurs in which boron serving as the p-type impurity in high-concentration p-type impurity diffusion layer 4 is incorporated into the thermal silicon oxide film.

Accordingly, in this case, there has been a problem that a surface of high-concentration p-type impurity diffusion layer 4 on which electrode for p-type 12 is formed has a decreased carrier concentration, which causes an increase in electrical contact resistance between high-concentration p-type impurity diffusion layer 4 and electrode for p-type 12 as well as a decrease in fill factor (F.F.) of the back electrode type solar cell, resulting in a decrease in power generation efficiency of the back electrode type solar cell.

In light of the circumstances above, an object of the present invention is to provide a method for manufacturing a photoelectric conversion element capable of suppressing a decrease in power generation efficiency and a photoelectric conversion element manufactured by the manufacturing method.

Solution to Problem

The present invention is a method for manufacturing a photoelectric conversion element including the steps of forming a p-type impurity diffusion layer by diffusing boron into a silicon substrate, forming an oxidation control mask on a surface of the p-type impurity diffusion layer in an area corresponding to an area where an electrode for p-type is to be formed, forming a thermal silicon oxide film on the surface of the p-type impurity diffusion layer, exposing part of the surface of the p-type impurity diffusion layer by removing the oxidation control mask formed on the surface of the p-type impurity diffusion layer in the area corresponding to the area where the electrode for p-type is to be formed, and forming the electrode for p-type on the part of the surface of the p-type impurity diffusion layer exposed by the removal of the oxidation control mask.

Herein, preferably, the method for manufacturing a photoelectric conversion element of the present invention includes the step of removing a portion of a boron glass layer formed on the surface of the p-type impurity diffusion layer, and the portion is in an area other than the area where the electrode for p-type is to be formed.

Preferably, in the method for manufacturing a photoelectric conversion element of the present invention, in the step of forming the oxidation control mask, the oxidation control mask is formed using at least one type of method selected from the group consisting of deposition of a silicon oxide film, deposition of a silicon nitride film, and application of a masking paste.

Furthermore, the present invention is a photoelectric conversion element manufactured by any of the above-described method for manufacturing a photoelectric conversion element, in which the surface of the p-type impurity diffusion layer in the area corresponding to the area where the electrode for p-type is formed has a carrier concentration of not less than $10^{19}$ cm$^{-3}$.

Advantageous Effects of Invention

The present invention can provide a method for manufacturing a photoelectric conversion element capable of suppressing a decrease in power generation efficiency and a photoelectric conversion element manufactured by the manufacturing method.

BRIEF DESCRIPTION OF DRAWINGS

FIG. 3 is a graph showing the relation between whether an oxidation control mask is formed or not and sheet resistance.

FIG. 4(a) is a schematic plan view of an example of the back surface of a back electrode type solar cell and FIG. 4(b) is a schematic cross sectional view along 4b-4b in FIG. 4(a).

DESCRIPTION OF EMBODIMENTS

Embodiments of the present invention will be hereinafter described. It is noted that the same reference signs shall represent the same or a corresponding portion in the present invention.

First Embodiment 1

Figure 1:
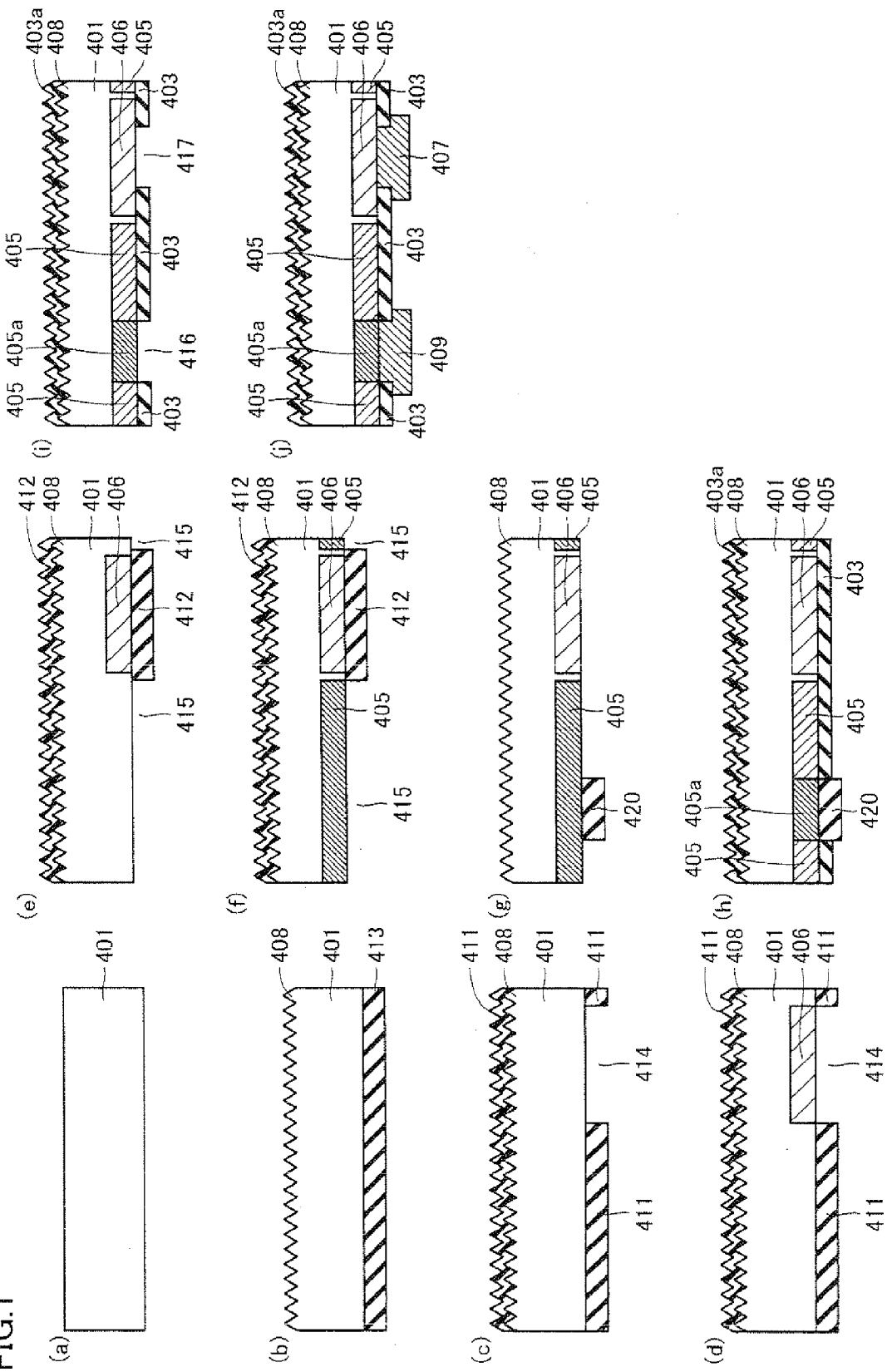
FIG. 1(a)-(j) is a schematic cross sectional view illustrating an example of a method for manufacturing a photoelectric conversion element of the present invention.

FIG. 1 (a)-(j) shows a schematic cross sectional view illustrating an example of a method for manufacturing a photoelectric conversion element of the present invention. An example of the method for manufacturing a photoelectric conversion element of the present invention will be described hereinafter with reference to FIG. 1(a)-(j).

First, an n-type silicon substrate 401 is prepared as shown in FIG. 1(a). Herein, n-type silicon substrate 401 can be implemented, for example, by a substrate made of polycrystalline silicon, monocrystalline silicon, or the like. N-type silicon substrate 401 is not particularly limited in size and shape and can have a quadrangular surface having a thickness not less than 100 μm and not more than 300 μm, and a length of one side not less than 100 mm and not more than 200 mm, for example.

It is preferable that n-type silicon substrate 401 be implemented by one from which slice damage produced by being sliced has been removed. Herein, the removal of the slice damage can be performed, for example, by etching the surface of n-type silicon substrate 401 with a mixed acid of a hydrogen fluoride aqueous solution and nitric acid, an alkaline aqueous solution such as sodium hydroxide, or the like.

Next, as shown in FIG. 1(b), a texture mask 413 is formed over the entire back surface of n-type silicon substrate 401, and then a textured structure 408 is formed on a light receiving surface of n-type silicon substrate 401.

Herein, textured structure 408 on the light receiving surface of n-type silicon substrate 401 can be formed, for example, by etching using a solution obtained by adding isopropyl alcohol to an alkaline aqueous solution such as sodium hydroxide or potassium hydroxide and heating the solution to, for example, not less than 70° C. and not more than 80° C. Since texture mask 413 has been formed over the entire back surface of n-type silicon substrate 401, textured structure 408 can be formed only on the light receiving surface of n-type silicon substrate 401, and a flat back surface of n-type silicon substrate 401 can be achieved.

Texture mask 413 can be implemented, for example, by a silicon oxide film, a silicon nitride film, a stack of a silicon oxide film and a silicon nitride film, or the like. It is noted that a silicon oxide film implementing texture mask 413 can be formed, for example, by steam oxidation, an atmospheric pressure CVD (Chemical Vapor Deposition) method, printing and firing of SOG (Spin On Glass), or the like. A silicon nitride film implementing texture mask 413 can be formed, for example, by a plasma CVD method, an atmospheric pressure CVD method, or the like.

Texture mask 413 is not particularly limited in thickness and can have a thickness of not less than 60 nm and not more than 100 nm, for example.

Texture mask 413 is removed once textured structure 408 has been formed. It should be noted, however, that texture mask 413 can be utilized as a first diffusion mask, which will be described later, without being removed.

Next, as shown in FIG. 1(c), first diffusion masks 411 are formed on the light receiving surface and the back surface of n-type silicon substrate 401, respectively, and then an opening 414 is formed by removing first diffusion mask 411 on the back surface of n-type silicon substrate 401 in an area corresponding to the area where an n-type impurity diffusion layer, which will be described later, is to be formed, and part of the back surface of n-type silicon substrate 401 is exposed in opening 414 of first diffusion mask 411.

Herein, first diffusion mask 411 can be implemented, for example, by a silicon oxide film, a silicon nitride film, a stack of a silicon oxide film and a silicon nitride film, or the like. It is noted that a silicon oxide film implementing first diffusion mask 411 can be formed, for example, by steam oxidation, an atmospheric pressure CVD (Chemical Vapor Deposition) method, printing and firing of SOG (Spin On Glass), or the like. A silicon nitride film implementing first diffusion mask 411 can be formed, for example, by a plasma CVD method, an atmospheric pressure CVD method, or the like.

First diffusion mask 411 can have a thickness of, for example, not less than 100 nm and not more than 300 nm when first diffusion mask 411 is made of a silicon oxide film, and can have a thickness of, for example, not less than 40 nm and not more than 80 nm when first diffusion mask 411 is made of a silicon nitride film.

Opening 414 of first diffusion mask 411 can be formed, for example, as follows.

First, a first etching paste is printed only on first diffusion mask 411 on the back surface of n-type silicon substrate 401 by, for example, a screen printing method or the like in a desired pattern. Herein, although the first etching paste is not particularly limited only if it is capable of etching first diffusion mask 411, the first etching paste can be implemented, for example, by one that contains phosphoric acid or ammonium hydrogen fluoride as an etching component, contains water, an organic solvent and a thickener as components other than the etching component, and is adjusted to a viscosity suitable for screen printing.

Next, through heat treatment of n-type silicon substrate 401 on which the first etching paste has been printed, only the portion with the first etching paste printed thereon of first diffusion mask 411 formed on the back surface of n-type silicon substrate 401 is etched and removed. A method of the heat treatment is not particularly limited and can be performed, for example, by heating with a hot plate, a belt furnace, or an oven. It is noted that n-type silicon substrate 401 with the first etching paste printed thereon is heat treated to a temperature of 100-400° C., for example.

After the heat treatment, the heat-treated first etching paste is removed by subjecting n-type silicon substrate 401 to immersion in water and application of ultrasonic waves for ultrasonic cleaning. This exposes part of the back surface of n-type silicon substrate 401 and forms opening 414.

It is noted that besides the ultrasonic cleaning above, the back surface of n-type silicon substrate 401 can be cleaned by commonly known SC-1 cleaning (RCA Standard Clean-1), SC-2 cleaning (RCA Standard Clean-2), cleaning with a mixture of sulfuric acid and a hydrogen peroxide aqueous solution, or cleaning with a dilute hydrogen fluoride aqueous solution or a cleaning liquid containing a surfactant.

Next, as shown in FIG. 1(d), phosphorus serving as an n-type impurity is diffused in the gas phase from opening 414 of first diffusion mask 411 for n-type silicon substrate 401, thereby forming an n-type impurity diffusion layer 406 at a portion of the back surface of n-type silicon substrate 401 exposed in opening 414 of first diffusion mask 411. Subsequently, first diffusion mask 411 for n-type silicon substrate 401 and a PSG (Phosphorus Silicate Glass) layer formed by the diffusion of phosphorus are entirely removed using a hydrogen fluoride aqueous solution or the like.

It is noted that n-type impurity diffusion layer 406 can also be formed otherwise, for example, by applying a solvent containing phosphorus to the portion of the back surface of n-type silicon substrate 401 exposed in opening 414 of first diffusion mask 411 and then diffusing the phosphorus in the solvent by heating.

Next, as shown in FIG. 1(e), second diffusion masks 412 are formed on the light receiving surface of n-type silicon substrate 401 and the back surface except the area where a p-type impurity diffusion layer is to be formed, respectively. That is, as to the back surface of n-type silicon substrate 401, part of the back surface of n-type silicon substrate 401 is exposed in an opening 415 of second diffusion mask 412.

Herein, second diffusion mask 412 can be implemented, for example, by a silicon oxide film, a silicon nitride film, a stack of a silicon oxide film and a silicon nitride film, or the like. It is noted that a silicon oxide film implementing second diffusion mask 412 can be formed, for example, by steam oxidation, an atmospheric pressure CVD method, printing and firing of SOG, or the like. A silicon nitride film implementing second diffusion mask 412 can be formed, for example, by a plasma CVD method, an atmospheric pressure CVD method, or the like.

Second diffusion mask 412 can have a thickness of, for example, not less than 100 nm and not more than 300 nm when second diffusion mask 412 is made of a silicon oxide film, and can have a thickness of, for example, not less than 40 nm and not more than 80 nm when second diffusion mask 412 is made of a silicon nitride film.

Opening 415 of second diffusion mask 412 can be formed, for example, as follows.

Firstly, second diffusion masks 412 are formed on n-type silicon substrate 401. Subsequently, a second etching paste is printed only on second diffusion mask 412 formed on the back surface of n-type silicon substrate 401 by, for example, a screen printing method or the like in a desired pattern. Herein, the second etching paste may be implemented by one that is the same as the first etching paste above in composition or may be implemented by one that is different from the first etching paste above in composition.

Next, through heat treatment of n-type silicon substrate 401 on which the second etching paste has been printed, only the portion with the second etching paste printed thereon of second diffusion mask 412 formed on the back surface of n-type silicon substrate 401 is etched. A method of the heat treatment is not particularly limited and can be performed, for example, by heating with a hot plate, a belt furnace, or an oven. It is noted that n-type silicon substrate 401 with the second etching paste printed thereon is heat treated to a temperature of 100-400° C., for example.

After the heat treatment, the heat-treated second etching paste is removed by subjecting n-type silicon substrate 401 to immersion in water and application of ultrasonic waves for ultrasonic cleaning. This exposes part of the back surface of n-type silicon substrate 401 and forms opening 415.

It is noted that besides the ultrasonic cleaning above, the hack surface of n-type silicon substrate 401 can be cleaned by commonly known SC-1 cleaning, SC-2 cleaning, cleaning with a mixture of sulfuric acid and a hydrogen peroxide aqueous solution, or cleaning with a dilute hydrogen fluoride aqueous solution or a cleaning liquid containing a surfactant.

Next, as shown in FIG. 1(f), a gas containing boron such as $BBr_3$ (boron tribromide) is used for gas phase diffusion from opening 415 of second diffusion mask 412 for n-type silicon substrate 401, thereby forming a p-type impurity diffusion layer 405 at a portion of the back surface of n-type silicon substrate 401 exposed in opening 415 of second diffusion mask 412. Subsequently, second diffusion masks 412 for n-type silicon substrate 401 and a BSG (Boron Silicate Glass) layer (not shown) formed by the diffusion of boron are entirely removed using a hydrogen fluoride aqueous solution or the like.

It is noted that p-type impurity diffusion layer 405 can also be formed otherwise, for example, by applying a solvent containing boron to the portion of the back surface of n-type silicon substrate 401 exposed in opening 415 of second diffusion mask 412 and then diffusing the boron in the solvent by heating. Nevertheless, a method for diffusing boron is not particularly limited.

The above-described step of forming p-type impurity diffusion layer 405 preferably includes a step of removing an area other than the area where an electrode for p-type is to be formed, of a boron glass layer (an amorphous layer containing boron) such as the BSG layer formed on a surface of p-type impurity diffusion layer 405. In this case, further suppression of a decrease in carrier concentration in p-type impurity diffusion layer 405 tends to be achieved when forming a passivation film made of a thermal silicon oxide film, which will be described later.

Next, as shown in FIG. 1(g), an oxidation control mask 420 is formed on the back surface of n-type silicon substrate 401 in an area corresponding to the area where an electrode for p-type on a surface of p-type impurity diffusion layer 405 is to be formed.

Herein, oxidation control mask 420 is not particularly limited only if it is capable of preventing formation of a passivation film made of a thermal silicon oxide film, which will be described later, and can be implemented, for example, by a silicon oxide film, a silicon nitride film, a stack of a silicon oxide film and a silicon nitride film, or the like.

It is noted that a silicon oxide film implementing oxidation control mask 420 can be formed, for example, by thermal CVD method, an atmospheric pressure CVD method, or the like. A silicon nitride film implementing oxidation control mask 420 can be formed, for example, by a plasma CVD method, an atmospheric pressure CVD method, or the like.

Furthermore, oxidation control mask 420 can also be formed, for example, by applying a masking paste. Herein, the method for applying the masking paste can be implemented, for example, by spray application, application with a dispenser, inkjet application, screen printing, letterpress printing, intaglio printing, planographic printing, or the like.

It is noted that the masking paste can be implemented, for example, by one that contains a solvent, a thickener and a silicon oxide precursor and/or a titanium oxide precursor. The masking paste can also be implemented by one that contains no thickener.

Herein, the solvent can be implemented, for example, by ethylene glycol, methyl cellosolve, methyl cellosolve acetate, ethyl cellosolve, diethyl cellosolve, cellosolve acetate, ethylene glycol monophenyl ether, methoxyethanol, ethylene glycol monoacetate, ethylene glycol diacetate, diethylene glycol, diethylene glycol monomethyl ether, diethylene glycol monoethyl ether acetate, diethylene glycol monobutyl ether, diethylene glycol monobutyl ether acetate, diethylene glycol dimethyl ether, diethylene glycol methyl ethyl ether, diethylene glycol diethyl ether, diethylene glycol acetate, triethyl glycol, triethylene glycol monomethyl ether, triethylene glycol monoethyl ether, tetraethylene glycol, liquid polyethylene glycol, propylene glycol, propylene glycol monomethyl ether, propylene glycol monoethyl ether, propylene glycol monobutyl ether, 1-butoxyethoxypropanol, dipropylglycol, dipropylene glycol monomethyl ether, dipropylene glycol monoethyl ether, tripropylene glycol monomethyl ether, polypropylene glycol, trimethylene glycol, butanedial, 1,5-pentanedial, hexylene glycol, glycerol, glyceryl acetate, glycerol diacetate, glyceryl triacetate, trimethylol propane, 1,2,6-hexanetriol, 1,2-propanediol, 1,5-pentanedial, octanediol, 1,2-butanediol, 1,4-butanediol, 1,3-butanediol, dioxane, trioxane, tetrahydrofuran, tetrahydropyran, methylal, diethyl acetal, methyl ethyl ketone, methyl isobutyl ketone, diethyl ketone, acetonylacetone, diacetone alcohol, methyl formate, ethyl formate, propyl formate, methyl acetate, or ethyl acetate, either alone or in combination of two or more kinds thereof.

Although the thickener is preferably implemented by ethyl cellulose, polyvinylpyrrolidone, or mixture of the both, the thickener can also be implemented by bentonite with various quality and property, a generally inorganic rheology additive for various polar solvent mixtures, nitrocellulose and other cellulose compounds, starch, gelatin, alginic acid, highly-dispersive amorphous silicic acid) (Aerosil®), polyvinyl butyral (Mowital®), sodium carboxymethylcellulose (vivistar), thermoplastic polyamide resin) (Eurelon®), an organic castor oil derivative (Thixin R®), diamide wax (Thixatrol Plus®), swelable polyacrylate (Rheolate®), polyether urea polyurethane, polyether polyol, or the like.

The silicon oxide precursor can be implemented, for example, by a substance represented by a general formula $R'_n Si (OR)_{4-n}$ (R' represents methyl, ethyl or phenyl, R represents methyl, ethyl, n-propyl, or i-propyl, n represents 0, 1 or 2) such as TEOS (tetraethyl orthosilicate).

Examples of the titanium oxide precursor include $Ti(OH)_4$ and a substance represented by $R'_n Ti (OR)_{4-n}$ (R' represents methyl, ethyl or phenyl, R represents methyl, ethyl, n-propyl, or i-propyl, n represents 0, 1 or 2) such as TPT (tetraisopropoxide titanium), and also include $TiCl_4$, $TiF_4$, $TiOSO_4$, and the like.

Patterning of oxidation control mask 420 on the back surface of n-type silicon substrate 401 can be performed, for example, in the following manner.

First, oxidation control mask 420 is formed on the entire back surface of n-type silicon substrate 401 in the above-described manner, and then a third etching paste is printed in a desired pattern on a portion of the surface of oxidation control mask 420 corresponding to an area other than the area where oxidation control mask 420 is intended to remain. Herein, the third etching paste may be implemented by one that is the same as the first or second etching paste above in composition or may be implemented by one that is different from the first or second etching paste above in composition.

Then, through heat treatment of n-type silicon substrate 401 on which the third etching paste has been printed, a portion with the third etching paste printed thereon of a portion of the back surface of n-type silicon substrate 401 with oxidation control mask 420 formed thereon is etched. It is noted that n-type silicon substrate 401 with the third etching paste printed thereon is heat treated to a temperature of 100-400° C., for example.

After the heat treatment, the heat-treated third etching paste is removed by subjecting n-type silicon substrate 401 to immersion in water and application of ultrasonic waves for ultrasonic cleaning. This exposes part of the back surface of n-type silicon substrate 401.

It is noted that besides the ultrasonic cleaning above, the back surface of n-type silicon substrate 401 can be cleaned by commonly known SC-1 cleaning (RCA Standard Clean-1), SC-2 cleaning (RCA Standard Clean-2), cleaning with a mixture of sulfuric acid and a hydrogen peroxide aqueous solution, or cleaning with a dilute hydrogen fluoride aqueous solution or a cleaning liquid containing a surfactant.

It is noted that aside from the method as above in which patterning is performed with the third etching paste after oxidation control mask 420 has been formed on the entire back surface of n-type silicon substrate 401, patterning of oxidation control mask 420 can also be achieved, for example, by applying the above-described masking paste in a desired pattern by screen printing.

Next, as shown in FIG. 1(h), n-type silicon substrate 401 is subjected to thermal oxidation, thereby forming a passivation film 403 made of a thermal oxide film (thermal silicon oxide film) over nearly the entire back surface of n-type silicon substrate 401 except a portion where oxidation control mask 420 has been formed.

It is noted that concurrently with formation of passivation film 403 made of a thermal oxide film on the back surface of n-type silicon substrate 401, a silicon oxide film 403a which is a thermal oxide film is also formed on the entire light receiving surface of n-type silicon substrate 401. Silicon oxide film 403a formed on the light receiving surface of n-type silicon substrate 401 also has a function as an antireflection film.

Passivation film 403 made of a thermal silicon oxide film can be formed, for example, by heating n-type silicon substrate 401 to 750° C.-1000° C. under an oxygen-containing atmosphere.

Furthermore, in forming passivation film 403, the boron concentration decreases in a region of p-type impurity diffusion layer 405 in contact with passivation film 403 because boron serving as the p-type impurity is incorporated from the region into passivation film 403, whereas the boron concentration increases locally in a region 405a of oxidation control mask 420 in contact with p-type impurity diffusion layer 405 because boron is less likely to be incorporated into oxidation control mask 420 as compared to passivation film 403.

Next, as shown in FIG. 1(i), oxidation control mask 420 and part of passivation film 403 on the back surface of n-type silicon substrate 401 are removed to form a contact hole 416 and a contact hole 417, respectively, and to expose, in contact hole 416 and contact hole 417, region 405a of p-type impurity diffusion layer 405 at the back surface of n-type silicon substrate 401 and n-type impurity diffusion layer 406 at the back surface of n-type silicon substrate 401, respectively.

Herein, each of contact hole 416 and contact hole 417 can be formed, for example, by the following method.

First, a fourth etching paste is printed on each of a surface of oxidation control mask 420 corresponding to the area where contact hole 416 is to be formed and a surface of passivation film 403 corresponding to the area where contact hole 417 is to be formed. Herein, the fourth etching paste may be implemented by one that is the same as the first, second or third etching paste in composition or may be implemented by one that is different from the first, second or third etching paste in composition.

Then, through heat treatment of n-type silicon substrate 401 on which the fourth etching paste has been printed, a portion with the fourth etching paste printed thereon of each of oxidation control mask 420 and, passivation film 403 on the back surface of n-type silicon substrate 401 can be etched. It is noted that, n-type silicon substrate 401 with the fourth etching paste printed thereon can be heat treated to a temperature of 100-400° C., for example.

After the heat treatment, the heat-treated fourth etching paste is removed by subjecting n-type silicon substrate 401 to immersion in water and application of ultrasonic waves for ultrasonic cleaning. This exposes part of the back surface of n-type silicon substrate 401.

It is noted that besides the ultrasonic cleaning above, the back surface of n-type silicon substrate 401 can be cleaned by commonly known SC-1 cleaning (RCA Standard Clean-1), SC-2 cleaning (RCA Standard Clean-2), cleaning with a mixture of sulfuric acid and a hydrogen peroxide aqueous solution, or cleaning with a dilute hydrogen fluoride aqueous solution or a cleaning liquid containing a surfactant.

Next, as shown in FIG. 1(j), an Ag paste, for example, is printed on each of contact hole 416 and contact hole 417 and then subjected to firing at, for example, 500-700° C., thereby forming an electrode for p-type 409 on region 405a of p-type impurity diffusion layer 405 and forming an electrode for n-type 407 on n-type impurity diffusion layer 406. This completes the back electrode type solar cell serving as an example of the photoelectric conversion element of the present invention.

Herein, in the back electrode type solar cell obtained as described above, the surface of region 405a of p-type impurity diffusion layer 405 in an area corresponding to the area where electrode for p-type 409 is formed preferably has a carrier concentration of not less than $10^{19}$ cm$^{-3}$. When the surface of region 405a of p-type impurity diffusion layer 405 in the area corresponding to the area where electrode for p-type 409 is formed has a carrier concentration of not less than $10^{19}$ cm$^{-3}$, the contact resistance between region 405a of p-type impurity diffusion layer 405 and electrode for p-type 409 can be made sufficiently small, and a decrease in fill factor F.F. of the photoelectric conversion element can be sufficiently suppressed.

The configuration of the back electrode type solar cell obtained as described above is not particularly limited.

As such, in the method for manufacturing the photoelectric conversion element of the present invention, oxidation control mask 420 can prevent the growth of passivation film 403 (thermal silicon oxide film) on the surface of p-type impurity diffusion layer 405 in an area corresponding to the area where electrode for p-type 409 is to be formed, and can prevent incorporation of boron into passivation film 403 (thermal silicon oxide film), and therefore, suppression of a decrease in carrier concentration in p-type impurity diffusion layer 405 can be achieved.

This enables suppression of an increase of contact resistance between p-type impurity diffusion layer 405 and electrode for p-type 409 to be achieved and enables suppression of a decrease in fill factor F.F. of the photoelectric conversion element to be achieved, and therefore, suppression of a decrease in power generation efficiency of the photoelectric conversion element can be achieved.

It is noted that although FIG. 1 (a)-(j) shows only one n-type impurity diffusion layer 406 as being formed at the back surface of n-type silicon substrate 401 for illustration purpose, a plurality of n-type impurity diffusion layers 406 may be formed in an actual configuration, with p-type impurity diffusion layer 405 formed between adjacent n-type impurity diffusion layers 406.

Furthermore, although the silicon substrate is implemented by n-type silicon substrate 401 in the above description, n-type silicon substrate 401 may be substituted by a p-type silicon substrate. When the silicon substrate is implemented by an n-type silicon substrate, the p-type impurity diffusion layer at the back surface of the silicon substrate and the n-type silicon substrate form a pn junction at the back surface of the silicon substrate. When the silicon substrate is implemented by a p-type silicon substrate, the n-type impurity diffusion layer at the back surface of the silicon substrate and the p-type silicon substrate form a pn junction at the back surface of the silicon substrate.

Furthermore, the concept of a photoelectric conversion element according to the present invention covers not only the above-described back electrode type solar cell of a configuration in which both of an electrode for n-type and an electrode for p-type are formed only on one surface (back surface) of a silicon substrate, but also solar cells of any configuration including a so-called rear-contact solar cell (a solar cell structured to draw out electric current from the back surface of the solar cell opposite to the light receiving surface), such as a MWT (Metal Wrap Through) cell (a solar cell of a configuration in which electrodes partly arranged in through holes provided in a silicon substrate) and a bifacial solar cell manufactured with electrodes formed at the light receiving surface and the back surface of a silicon, respectively.

Second Embodiment

FIG. 2(a)-(k) provides a schematic cross sectional view illustrating another example of a method for manufacturing a photoelectric conversion element of the present invention. An example of the method for manufacturing a photoelectric conversion element of the present invention will be described hereinafter with reference to FIG. 2(a)-(k).

Figure 2:
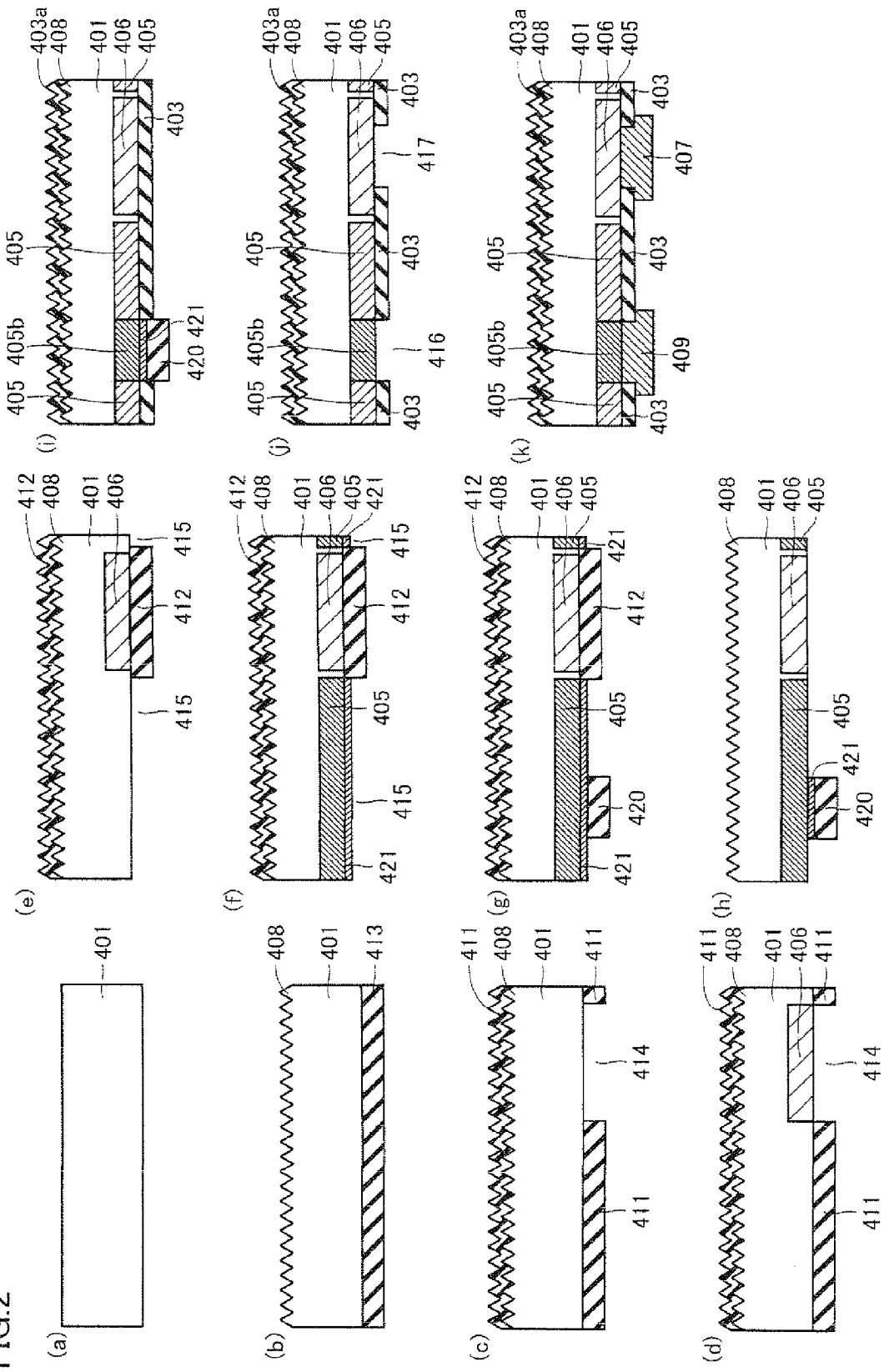
FIG. 2(a)-(k) is a schematic cross sectional view illustrating another example of a method for manufacturing a photoelectric conversion element of the present invention.

First, an n-type silicon substrate 401 is prepared as shown in FIG. 2(a). A texture mask 413 is formed over the entire back surface of n-type silicon substrate 401, and then a textured structure 408 is formed on a light receiving surface of n-type silicon substrate 401, as shown in FIG. 2(b).

Next, as shown in FIG. 2(c), first diffusion masks 411 are formed on the light receiving surface and the back surface of n-type silicon substrate 401, respectively, and then an opening 414 is formed by removing first diffusion mask 411 on the back surface of n-type silicon substrate 401 in an area corresponding to the area where an n-type impurity diffusion layer, which will be described later, is to be formed, and part of the back surface of n-type silicon substrate 401 is exposed in opening 414 of first diffusion mask 411.

Next, as shown in FIG. 2(d), phosphorus serving as an n-type impurity is diffused in the gas phase from opening 414 of first diffusion mask 411 for n-type silicon substrate 401, thereby forming an n-type impurity diffusion layer 406 at the back surface of n-type silicon substrate 401 exposed in opening 414 of first diffusion mask 411. Subsequently, first diffusion mask 411 for n-type silicon substrate 401 and a PSG layer formed by the diffusion of phosphorus are entirely removed using a hydrogen fluoride aqueous solution or the like.

Next, as shown in FIG. 2(e), second diffusion masks 412 are formed on the light receiving surface of n-type silicon substrate 401 and the back surface except the area where a p-type impurity diffusion layer is to be formed, respectively. That is, as to the back surface of n-type silicon substrate 401, part of the back surface of n-type silicon substrate 401 is exposed in opening 415 of second diffusion mask 412.

Next, as shown in FIG. 2(f), a gas containing boron such as BBr$_3$ is used for gas phase diffusion from opening 415 of second diffusion mask 412 for n-type silicon substrate 401, thereby forming a p-type impurity diffusion layer 405 at a portion of the back surface of n-type silicon substrate 401 exposed in opening 415 of second diffusion mask 412. The steps up to this point are the same as those in the first embodiment.

Now, in the present embodiment, second diffusion masks 412 and a BSG layer 421 formed by the diffusion of boron are not removed from n-type silicon substrate 401.

Next, as shown in FIG. 2(g), an oxidation control mask 420 is formed on the back surface of n-type silicon substrate 401 in an area corresponding to the area where an electrode for p-type on a surface of p-type impurity diffusion layer 405 is to be formed.

Next, as shown in FIG. 2(h), BSG layer 421 and second diffusion masks 412 formed in a region other than the region covered by oxidation control mask 420 are entirely removed. As a result, what only remains is BSG layer 421 in a region between the back surface of n-type silicon substrate 401 and oxidation control mask 420. It is noted that if oxidation control mask 420 and second diffusion mask 412 are removable with, for example, the same etchant, then oxidation control mask 420 can be formed with a thickness greater than that of second diffusion mask 412 so that oxidation control mask 420 may remain when the second diffusion mask 412 is entirely removed.

Next, as shown in FIG. 2(i), n-type silicon substrate 401 is subjected to thermal oxidation, thereby forming a passivation film 403 made of a thermal oxide film (thermal silicon oxide film) over nearly the entire back surface of n-type silicon substrate 401 except a portion where oxidation control mask 420 has been formed.

Herein, concurrently with formation of passivation film 403 made of a thermal silicon oxide film on the back surface of n-type silicon substrate 401, a silicon oxide film 403a which is a thermal silicon oxide film is also formed on the entire light receiving surface of n-type silicon substrate 401. Silicon oxide film 403a formed on the light receiving surface of n-type silicon substrate 401 also has a function as an antireflection film.

In forming passivation film 403, the boron concentration decreases in a region of p-type impurity diffusion layer 405 in contact with passivation film 403 because boron serving as the p-type impurity is incorporated from the region into passivation film 403, whereas the boron concentration increases locally in a region 405b of p-type impurity diffusion layer 405 in contact with BSG layer 421 because boron is less likely to be incorporated as compared to passivation film 403.

Next, as shown in FIG. 2(j), each of oxidation control mask 420, BSG layer 421 and part of passivation film 403 on the back surface of n-type silicon substrate 401 are removed to form a contact hole 416 and a contact hole 417, and to expose, in contact hole 416 and contact hole 417, high-boron-concentration region 405b at the back surface of n-type silicon substrate 401 and n-type impurity diffusion layer 406 at the back surface of n-type silicon substrate 401, respectively. It is noted that, BSG layer 421 is removable, for example, with an etching paste containing a component capable of removing BSG layer 421.

Next, as shown in FIG. 2(k), an Ag paste, for example, is printed on each of contact hole 416 and contact hole 417 and then subjected to firing at, for example, 500-700° C., thereby forming an electrode for p-type 409 on region 405b and forming an electrode for n-type 407 on n-type impurity diffusion layer 406. This completes the back electrode type solar cell serving as an example of the photoelectric conversion element of the present invention.

Description of the present embodiment except the foregoing is similar to that of the first embodiment, and is thus not repeated herein.

EXAMPLES

An experiment has been conducted to confirm the effect of an oxidation control mask formed on the back surface of an n-type silicon substrate.

First, boron was diffused into the back surface of an n-type silicon substrate by gas phase diffusion with BBr$_3$ to form a p-type impurity diffusion layer, and a BSG layer generated concurrently with the formation of the p-type impurity diffusion layer was entirely removed with a hydrogen fluoride aqueous solution, followed by measurement of the sheet resistance of the p-type impurity diffusion layer by a four-terminal method. The result confirmed that the sheet resistance of the p-type impurity diffusion layer was less than 60Ω/□, as shown by the bar indicated as after diffusion in the bar graph of FIG. 3.

Next, an oxidation control mask was formed on part of the p-type impurity diffusion layer at the n-type silicon substrate. Herein, the oxidation control mask was formed by depositing a silicon oxide film with a thickness of 200 nm on the back surface of the n-type silicon substrate through a thermal CVD method (formation temperature: 450° C., gas flow ratio: $SiH_4/O_2=1$).

Next, the n-type silicon substrate was heat-treated in an oxygen-containing atmosphere at 950° C. to form a passivation film made of a thermal silicon oxide film on a portion of the back surface of the n-type silicon substrate where the oxidation control mask above had not been formed.

Subsequently, the oxidation control mask and the passivation film on the back surface of n-type silicon substrate were removed, followed by measurement of the sheet resistance of the p-type impurity diffusion layer by a four-terminal method. The result was that the p-type impurity diffusion layer at the portion where the oxidation control mask had been formed had an sheet resistance of the order of 100Ω/□, as shown by the bar indicated as Example 1 in the bar graph of FIG. 3, while the p-type impurity diffusion layer at the portion where the passivation film had been formed had an sheet resistance of the order of 120Ω/□, as shown by the bar indicated as Comparative Example in the bar graph of FIG. 3.

Furthermore, a sample was prepared in the same manner as that of Example 1 except that the above-described passivation film was formed without removal of the BSG layer at the portion covered by the oxidation control mask on the back surface of n-type silicon substrate, and the BSG layer was subsequently removed. Thereafter, the sheet resistance of the p-type impurity diffusion layer exposed by the removal of the BSG layer at the portion covered by the oxidation control mask in the sample was measured in the same manner as in Example 1. The result was that the BSG layer at the portion covered by the oxidation control mask had a sheet resistance of the order of 80Ω/□, as shown by the bar indicated as Example 2 in the bar graph of FIG. 3, providing a more excellent result.

In view of the above results, it is considered that the portion of the p-type impurity diffusion layer where the oxidation control mask was formed had a higher carrier concentration than the carrier concentration of the portion of the p-type impurity diffusion layer where the passivation film was formed, and thus had a lower sheet resistance.

Therefore, as compared to a photoelectric conversion element obtained by forming an electrode for p-type on the surface of a p-type impurity diffusion layer without forming an oxidation control mask, a photoelectric conversion element obtained by forming an electrode for p-type on a p-type impurity diffusion layer at a portion where an oxidation control mask was formed is capable of suppressing an increase in contact resistance of the electrode for p-type to the p-type impurity diffusion layer, and therefore, capable of suppressing a decrease in power generation efficiency of the photoelectric conversion element.

It should be understood that the embodiments and the examples disclosed herein are by way of illustration in every respect, not by way of limitation. The scope of the present invention is defined by claims, not by the description above, and is intended to include all modifications within the meaning and scope equivalent to the claims.

INDUSTRIAL APPLICABILITY

The present invention can provide a method for manufacturing a photoelectric conversion element capable of suppressing a decrease in power generation efficiency and a photoelectric conversion element manufactured by the manufacturing method. Thus, the photoelectric conversion element of the present invention is considered to be suitably utilized for a solar cell.

REFERENCE SIGNS LIST 1, 401 n-type silicon substrate; 3 high-concentration n-type impurity diffusion layer; 4 high-concentration p-type impurity diffusion layer; 8, 408 textured structure; 9, 403 passivation film; 10 antireflection film; 11 electrode for n-type; 12 electrode for p-type; 403a silicon oxide film; 405 p-type impurity diffusion layer; 405a region; 406 n-type impurity diffusion layer; 407 electrode for n-type; 409 electrode for p-type; 411 first diffusion mask; 412 second diffusion mask; 413 texture mask; 414, 415 opening; 416, 417 contact hole; 420 oxidation control mask; 421 BSG layer.

The invention claimed is:

1. A method for manufacturing a photoelectric conversion element, comprising the steps of:
    forming a p-type impurity diffusion layer by diffusing boron into a silicon substrate;
    forming an oxidation control mask on a surface of said p-type impurity diffusion layer in an area corresponding to an area where an electrode for p-type is to be formed;
    forming a thermal silicon oxide film on the surface of said p-type impurity diffusion layer;
    exposing part of the surface of said p-type impurity diffusion layer by removing said oxidation control mask formed on the surface of said p-type impurity diffusion layer in the area corresponding to the area where the electrode for p-type is to be formed;
    forming the electrode for p-type on the part of the surface of said p-type impurity diffusion layer exposed by the removal of said oxidation control mask; and
    removing a portion of a boron glass layer formed on the surface of said p-type impurity diffusion layer, the portion being in an area other than the area where the electrode for p-type is to be formed.

2. The method for manufacturing a photoelectric conversion element according to claim 1, wherein in said step of forming said oxidation control mask, said oxidation control mask is formed using at least one type of method selected from the group consisting of deposition of a silicon oxide film, deposition of a silicon nitride film, and application of a masking paste.

3. A photoelectric conversion element manufacture by the method for manufacturing a photoelectric conversion element according to claim 1, wherein the surface of said p-type impurity diffusion layer in the area corresponding to the area where said electrode for p-type is formed has a carrier concentration of not less than $10^{19}$ cm$^{-3}$.

* * * * *